United States Patent [19]
Higuchi

[11] 4,374,430
[45] Feb. 15, 1983

[54] SEMICONDUCTOR PROM DEVICE

[75] Inventor: Mitsuo Higuchi, Tokyo, Japan

[73] Assignee: Fujitsu Limited, Kawasaki, Japan

[21] Appl. No.: 210,675

[22] Filed: Nov. 26, 1980

[30] Foreign Application Priority Data

Nov. 26, 1979 [JP] Japan .............................. 54-152832

[51] Int. Cl.$^3$ ............................................ G11C 11/40
[52] U.S. Cl. .................................. 365/104; 307/449;
365/45
[58] Field of Search ................. 365/45, 103, 104, 182,
365/185, 189; 307/449

[56] References Cited
U.S. PATENT DOCUMENTS 4,327,424  4/1982  Wu ..................................... 365/168

Primary Examiner—Terrell W. Fears
Attorney, Agent, or Firm—Staas & Halsey

[57] ABSTRACT

A semiconductor PROM device comprising a plurality of word address decoders, each of the word address decoders having a decoder section and a high potential voltage supplying section including a transistor. The transistor is connected between one of the word lines and a high potential voltage source and is turned on when programming is effected. The semiconductor PROM device further comprises a plurality of gated program signal generators each of which is supplied with a part of input address signals for selecting a block of a plurality of the word address decoders. Each of gated program signals from the gated program signal generators is applied to the gate electrode of the transistor of the word address decoder whose input address signals include part of the input address signals supplied to the gated program signal generator.

6 Claims, 4 Drawing Figures

SEMICONDUCTOR PROM DEVICE

BACKGROUND OF THE INVENTION (1) Field of the Invention

The present invention relates to a semiconductor PROM (Programmable Read Only Memory) device, more particularly to a semiconductor PROM device which uses a high potential voltage to write into information to the semiconductor PROM device, and which is used, for example, in an electronic computer.

(2) Description of the Prior Art

In a PROM device such as an EPROM (Erasable and Programmable Read Only Memory) device, the writing of information into each of the memory cells is effected by supplying a high potential voltage to each of the memory cells.

As illustrated in FIG. 1, the EPROM device comprises a plurality of memory cells $C_{ij}$ (i=1, 2, ..., n; j=1, 2, ..., m) disposed in a matrix of n rows and m columns. Each of the memory cells $C_{ij}$ is composed, for example, of a well known floating gate type field effect transistor which is connected between one of word lines $WL_1, WL_2, ..., WL_n$ and one of bit lines (or column lines) $BL_1, BL_2, ..., BL_m$. Each of the bit lines $BL_1, BL_2, ..., BL_m$ is connected through one of the gate transistors $Q_{C1}, Q_{C2}, ..., Q_{Cm}$ respectively to a data input line $D_{in}$. The data input line $D_{in}$ is connected through a switching transistor $Q_S$ to a data output line $D_{out}$ which is connected to a voltage source $V_{CC}$ of, for example, 5 V through a load transistor $Q_L$.

In the EPROM device of FIG. 1, the writing of information, i.e., programming a memory cell such as $C_{12}$ is effected by supplying a very high potential voltage, for example 20 V, to the selected word line $WL_1$ and supplying a very high potential voltage, for example 20 V, to the data input line $D_{in}$. Also, a bit address signal B is caused to be high and the inverted program signal $\overline{PRG}$ is caused to be low, so that the gate transistor $Q_{C2}$ is turned on and the switching transistor $Q_S$ is turned off. Therefore, programming is achieved by simultaneously applying very high voltages to the drain and the control gate of the selected memory cell $C_{12}$. Hot electrons are generated in the channel of the memory cell $C_{12}$ and injected into the floating gate, resulting in an upward shift in threshold voltage $V_T$ of the memory cell transistor $C_{12}$.

Reading information from the selected memory cell, for example, $C_{12}$ is effected by supplying a high potential voltage, for example 5 V, to the selected word line $WL_1$. Also, the bit address signal $B_2$ is set to a high potential and the inverted program signal $\overline{PRG}$ is set to a high potential, so that the gate transistor $Q_{C2}$ is turned on and the switching transistor $Q_S$ is turned on. If the floating gate of the memory cell $C_{12}$ is charged, no current flows through the main current path of the memory cell transistor $C_{12}$, so that the potential level of the data output line $D_{out}$ becomes high. If the floating gate of the memory cell $C_{12}$ is not charged, a current flows from the positive voltage source $V_{CC}$ through the transistors $Q_L, Q_S, Q_{C2}$ and through the memory cell transistor $C_{12}$ to the ground. Therefore, the potential level of the data output line $D_{out}$ becomes low.

FIG. 2 illustrates a conventional word address decoder DEC having a decoder section and a high potential voltage supplying section HV connected between an output terminal A of the decoder section and the word line WL. The decoder section of the decoder DEC comprises a NOR gate $NOR_1$ consisting of enhancement type transistors $Q_{20}, Q_{21}, Q_{22}, ...$ and a depletion type load transistor $Q_1$. The decoder section of the decoder DEC further comprises an output buffer circuit OB consisting of a depletion type load transistor $Q_3$, a depletion type transistor $Q_5$ and enhancement type transistors $Q_4, Q_6$. The high potential voltage supplying section HV comprises a depletion type transistor $Q_7$ whose main current path is connected between the output terminal A of the decoder section of the decoder DEC and the word line WL, and, a first transistor $Q_8$ of an enhancement type and a second transistors $Q_9$ of a depletion type which are connected in series between the word line WL and a high potential voltage $V_{PP}$ of, for example, 25 V.

The circuit of FIG. 2 operates as follows. When the word line WL is selected, the potential levels of address signals $\bar{a}_0, a_1, a_2, ...$ are all low and the transistors $Q_{20}, Q_{21}, Q_{22}, ...$ are all turned off so that the NOR gate $NOR_1$ outputs a signal of high potential level. Therefore, the transistors $Q_4$ and $Q_5$ of the output buffer circuit OB are turned on and the transistor $Q_6$ is turned off, so that the potential level of the output point A of the output buffer circuit OB becomes high.

When the writing of information is effected, the program signal PRG supplied to the gate electrode of the enhancement type transistor $Q_8$ of the high potential voltage supplying section HV is set to a high potential. Therefore, the transistor $Q_8$ is turned on and a current is supplied from the high potential voltage source $V_{PP}$, whose potential voltage is, for example, 25 V, through the transistor $Q_8$ and the depletion type transistor $Q_9$ to the word line WL. In this condition, the potential level of an inverted signal $\overline{PRG}$ of the program signal is low, i.e., 0V and the potential level of the output point A is high. Consequently, the transistor $Q_7$, whose main current path is connected between the output point A and the selected word line WL, is turned off, because the gate threshold potential $V_{th}$ of the transistor $Q_7$ is larger than $-V_{CC}$ and is smaller than 0 (i.e., $0 > V_{th} > -V_{CC}$, for example, $V_{th} = -V_{CC}/2$). Therefore, the potential level of the selected word line WL is nearly equal to $V_{PP}$, i.e. 25 V, in the write-in mode.

When the reading of information is effected, the program signal PRG is caused to be low and the inverted signal $\overline{PRG}$ is caused to be high. Consequently, the transistor $Q_8$ is turned off, the transistor $Q_7$ is turned on, and a current flows from the voltage source $V_{CC}$ through the depletion type transistor $Q_5$ of the output buffer circuit OB and the transistor $Q_7$ to the selected word line WL. Therefore, the potential level of the selected word line WL is nearly equal to $V_{CC}$, i.e. 5 V, in the read-out mode.

In the non-selected condition of the word line WL of FIG. 2, the potential level of at least one of the address signals $\bar{a}_0, a_1, a_2, ...$ is high and at least one of the transistors $Q_{20}, Q_{21}, Q_{22}, ...$ is turned on. Therefore, the NOR gate $NOR_1$ outputs a signal of low potential level, the transistor $Q_4$ is turned off and the transistor $Q_6$ is turned on, so that the potential of the output point A becomes low. In this condition, when the program signal PRG is high in the write-in mode, the transistor $Q_8$ is turned on, and, the transistor $Q_7$ is also turned on. This is because the gate signal $\overline{PRG}$ of the transistor $Q_7$ is low, the potential level of the output point A is low, and the gate threshold potential $V_{th}$ of the transistor $Q_7$ is larger than $-V_{CC}$ and smaller than 0, as mentioned above. Therefore, an idle current flows from the high potential voltage source $V_{PP}$ through the transistors $Q_8$, $Q_9$, $Q_7$ and $Q_6$ to the ground, and the potential of the word line WL becomes low. The transistor $Q_9$ operates to pull up the word line WL to a high potential level when writing information. When the potential level of the word line WL becomes very high, the gate threshold potential $V_{th}$ rises due to the well known back gate bias effect. Therefore, the gate threshold potential $V_{th}$ of the transistor $Q_9$ is set to a low negative value, for example $-5$ V, in order to keep the transistor $Q_9$ in a turned on condition and pull up the word line WL to a very high potential level. Consequently, the above-mentioned idle current becomes large and the power consumption of the memory device increases.

The semiconductor memory device, for example the EPROM device, uses a large number of word address decoders and high potential voltage supplying sections. That is, the memory device uses the same number of word address decoders and high potential voltage supplying sections as there are word lines. Moreover, only one of the word lines can be selected at a time and all the other word lines are in non-selected condition. Therefore, the above-mentioned idle current becomes very large.

Two methods are employed in order to stop or decrease the idle current: (1) to increase the channel length of the transistor $Q_8$; and (2) to increase the channel length of the transistor $Q_9$. However, in both cases, the integration density of the semiconductor memory device is decreased. Therefore, in the conventional memory device, the gate threshold potential $V_{th}$ of the transistor $Q_9$ is set to be a low negative value, but, the channel length of the transistors $Q_8$ and $Q_9$ is not increased.

Consequently, in the conventional semiconductor memory device, the idle current flowing in the non-selected decoders in the write-in or programming mode increases and the power consumption of the semiconductor memory device increases according to the number of the word address decoders.

SUMMARY OF THE INVENTION

It is the principal object of the present invention to reduce the power consumption of the semiconductor memory device, by decreasing the idle current flowing from a high potential voltage supply to the non-selected word address decoders, when writing information into the semiconductor PROM device.

According to the present invention, there is provided a semiconductor PROM device comprising a plurality of word address decoders, each of the word address decoders having a decoder section and a high potential voltage supplying section including a transistor which is connected between one of word lines and a high potential voltage source and which is turned on when programming is effected. The semiconductor PROM device further comprises a plurality of gated program signal generators each of which is supplied with some of the input address signals for selecting a block of the word address decoders. Each of the gated program signals from the gated program signal generators is applied to the gate electrode of the transistor of the word address decoder whose input address signals include the input address signals supplied to the gated program signal generator.

DESCRIPTION OF THE PREFERRED EMBODIMENTS

Figure 1:
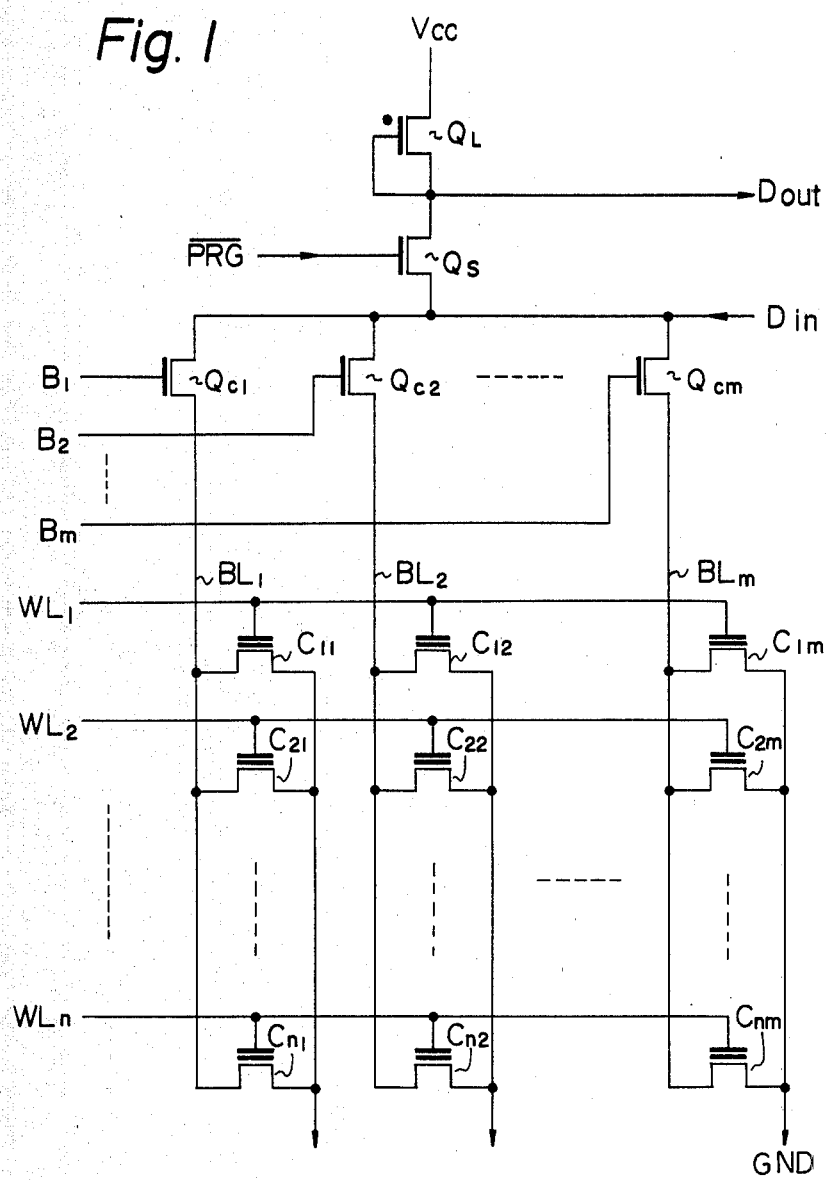
FIG. 1 is a partial circuit diagram of a portion of conventional EPROM device.
Figure 2:
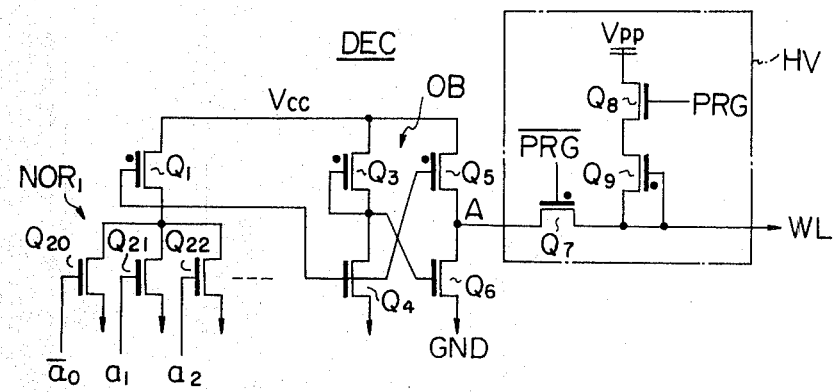
FIG. 2 is a circuit diagram of a conventional word address decoder.
Figure 3:
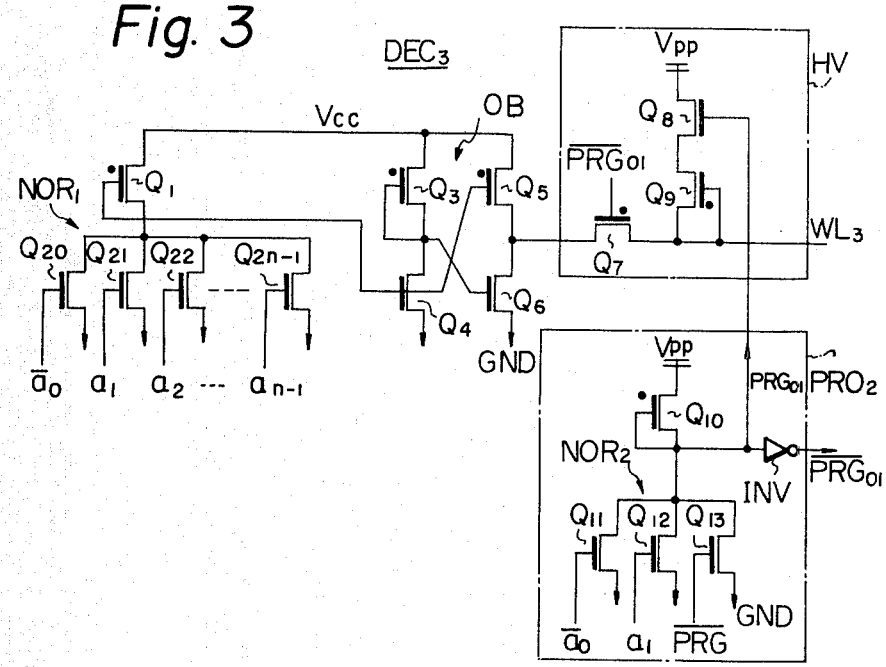
FIG. 3 is a circuit diagram of a word address decoder as an embodiment of the present invention.

With reference to the accompanying FIGS. 3 and 4, a semiconductor PROM device according to the present invention will now be explained. The same parts appearing in FIGS. 3 and 4 as appear in FIG. 2 are designated by the same reference symbols and an explanation therefore is omitted. In FIG. 3, a word address decoder $DEC_3$, containing a decoder section and a high potential voltage supplying section HV, is connected to a word line $WL_3$ which is selected by address signals $\bar{a}_0$, $a_1, a_2, \ldots, a_{n-1}$. The structure of the word address decoder $DEC_3$ is the same as that of the word address decoder DEC of FIG. 2, except that the gate electrode of transistors $Q_7$ and $Q_8$ are supplied with gated program signals $PRG_{01}$ and $\overline{PRG}_{01}$, instead of the program signals PRG and $\overline{PRG}$, from a gated program signal generator $PRO_2$ which is newly provided according to the present invention. The gated program signal generator $PRO_2$ comprises a NOR gate $NOR_2$ including gate transistors $Q_{11}$, $Q_{12}$, $Q_{13}$ and a load transistor $Q_{10}$, and, an inverter INV. The gated program signal generator $PRO_2$ outputs the gated program signal $PRG_{01}$ of high potential level, i.e., $V_{PP}$ and the gated program signal $\overline{PRG}_{01}$ of low potential level, i.e., 0V which is the inversion of $PRG_{01}$. The inversion of the gated program signal $PRG_{01}$ is effected by the inverter INV. The signals $PRG_{01}$ and $\overline{PRG}_{01}$ are applied to the gate electrodes of the transistors $Q_8$ and $Q_7$, respectively. Input terminals of the NOR gate $NOR_2$, i.e., the gate electrodes of the transistors $Q_{11}$, $Q_{12}$ and $Q_{13}$, are supplied with the address signals $a_0$, $a_1$ and the inverted program signal $\overline{PRG}$. When reading of information, the inverted program signal $\overline{PRG}$ becomes high, thereby making the gated program signal $PRG_{01}$ low and the inverted signal $\overline{PRG}_{01}$ high, disabled a write circuit which is not shown in the drawing, and enabling a read circuit such as a sense amplifier which also is not shown in the drawing. The two bit address signals $\bar{a}_0$ and $a_1$ applied to the input terminals of the NOR gate $NOR_2$ are selected from the n bits of address signals $a_0, a_1, \ldots, a_{n-1}$. The two bit address signals $\bar{a}_0$ and $a_1$ divide the $2^n$ word lines, which can be designated by the n bit address signals $a_0$, $a_1, \ldots, a_{n-1}$, into four groups. If the m bit address signals selected from the n bit address signals $a_0, a_1, \ldots, a_{n-1}$ are applied to the NOR gate $NOR_2$, the $2^n$ word lines are divided into $2^m$ groups. The address signals applied to the program signal generator are selected from the address signals applied to the word address decoder which is also supplied with a gated program signal from the program signal generator. In the embodiment of FIG. 2, the lower two bits $\bar{a}_0$ and $a_1$ of the address signals $a_0, a_1, \ldots, a_{n-1}$ applied to the decoder $DEC_3$, are applied to the program signal generator $PRO_2$.

Figure 4:
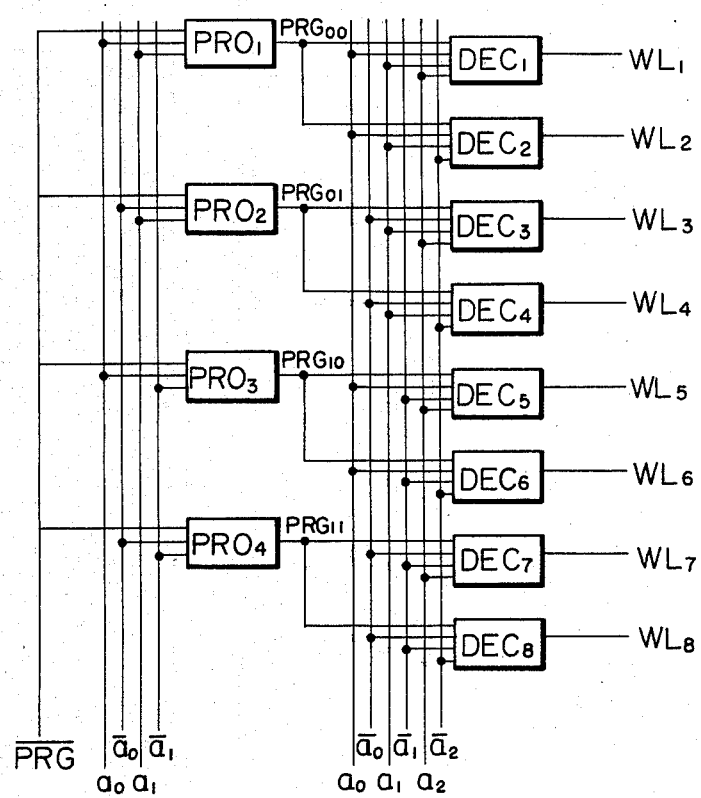
FIG. 4 is a block circuit diagram of the connections to the word address decoders.

FIG. 4 illustrates the connections between the gated program signal generators and the word address decoders for the condition of n=3 and m=2. That is, eight word lines are divided into four groups. In FIG. 4, each of the word address decoders, $DEC_1$ through $DEC_8$, has the same circuit structure as the decoder $DEC_3$ of FIG. 3 and is provided with three bit address signals. The word address decoder $DEC_1$ is supplied with the address signals $a_0$, $a_1$, $a_2$; the word address decoder $DEC_2$ is supplied with the address signals $a_0$, $a_1$, $\bar{a}_2$; ... ; and the word address decoder $DEC_8$ is supplied with the address signals $\bar{a}_0$, $\bar{a}_1$, $\bar{a}_2$. Each of the word address decoders $DEC_1$ through $DEC_8$ selects a corresponding one of the word lines $WL_1$ through $WL_8$. Each of the gated program signal generators $PRO_1$ through $PRO_4$ has the same circuit structure as the gated program signal generator $PRO_2$ of FIG. 3. The gated program signal generators $PRO_1$, $PRO_2$, $PRO_3$ and $PRO_4$ are respectively supplied with sets of two bit address signals $\bar{a}_0$, $a_1$; $a_0$, $a_1$; $a_0$, $\bar{a}_1$ and $\bar{a}_0$, $\bar{a}_1$. Output signals $PRG_{00}$ through $PRG_{11}$ from the gated program signal generators $PRO_1$ through $PRO_4$ are respectively applied to pairs of word address decoders ($DEC_1$, $DEC_2$), ($DEC_3$, $DEC_4$), ($DEC_5$, $DEC_6$) and ($DEC_7$, $DEC_8$) which are supplied with the address signals containing the sets of two bit address signals $a_0$, $a_1$; $a_0$, $a_1$; $a_0$, $a_1$; $a_0$, $a_1$ respectively. Inverted output signals $\overline{PRG_{00}}$ through $\overline{PRG_{11}}$ from the gated program signal generators $PRO_1$ through $PRO_4$ are also supplied respectively to the pairs of the word address decoders ($DEC_1$, $DEC_2$), ($DEC_3$, $DEC_4$), ($DEC_5$, $DEC_6$) and ($DEC_7$, $DEC_8$). However, illustration of these signals is omitted from FIG. 4 for the sake of simplicity.

In the above-mentioned structure, when writing information, i.e., programming, the inverted signal $\overline{PRG}$ is low. In this condition, assume that the address signals $a_0$ and $a_1$ are both low, thus the output signal $PRG_{01}$ from the gated program signal generator $PRO_2$ becomes high and the transistors $Q_8$ in the decoders $DEC_3$ and $DEC_4$ are turned on. However, the output signals $PRG_{00}$, $PRG_{10}$ and $PRG_{11}$ from the gated program signal generators $PRO_1$, $PRO_3$ and $PRO_4$ are all low and the transistors $Q_8$ in the other decoders $DEC_1$, $DEC_2$ and $DEC_5$ through $DEC_8$ are all turned off. Therefore, the aforementioned idle current does not flow in these other non-selected decoders. Only one of the decoders $DEC_3$ and $DEC_4$ is selected according to the condition of the remaining address signal $a_2$ or $\bar{a}_2$. For example, when the address signal $a_2$ is low, the decoder $DEC_3$ is selected and the other decoder $DEC_4$ is not selected. The aforementioned idle current flows in the non-selected decoder $DEC_4$. However, in this case, the idle current flows in only one decoder $DEC_4$ and therefore the amount of the idle current decreases to 1/7 of that of the conventional memory device having the word address decoder of FIG. 2.

The idle current can be decreased to zero by applying three bit address signals to each of the eight gated program signal generators in order to select only one of them and by applying the gated program signal from the selected generator to a selected one of the decoders $DEC_1$ through $DEC_8$. However, such a system requires the same number of gated program signal generators as word address decoders and requires a large number of semiconductor elements and connecting leads. Consequently, the integration density of the memory device which uses such a system is decreased. Therefore, it is preferable to use a smaller number of gated program signal generators than word address decoders.

It should be noted that, in FIGS. 3 and 4, any set of two bit address signals can be applied to the gated program signal generators. For example, in FIGS. 3 and 4, the sets of address signals consisting of $a_0$ (or $\bar{a}_0$) and $a_2$ (or $\bar{a}_2$) or consisting of $a_1$ (or $\bar{a}_1$) and $a_2$ (or $\bar{a}_2$) can be used.

According to the present invention, in a semiconductor memory device comprising a plurality of word address decoders each of which has a high potential voltage supplying section in the output stage, the word address decoders are divided into a plurality of blocks. Only one of the blocks is selected and the other blocks are deselected so that the high potential voltage supplying section of the deselected word address decoders are blocked. Therefore, the total power dissipation of the memory device being programmed can be greatly reduced.

I claim:

1. A semiconductor PROM device operatively connected to receive input address signals, a high potential voltage, and a programming signal, comprising:
    a plurality of word lines;
    a plurality of word address decoders organized in blocks and operatively connected to respective of said word lines, each of said word address decoders including:
        a decoder section for receiving said input address signals and for selecting said respective word line in accordance with said input address signals; and
        a high potential voltage supplying section, for receiving and providing said high potential voltage, including
        a first transistor which is connected between a respective one of said word lines and said high potential voltage and which is turned on in dependence upon said programming signal; and
        a second transistor which is connected between an output terminal of said decoder section and said respective one of said word lines,
    a plurality of gated program signal generators, operatively connected to respective ones of said blocks of word address decoders, for receiving specified signals of said input address signals and for generating a gated program signal for selecting said respective ones of said blocks of word address decoders, each of said blocks comprising one or more of said word address decoders associated with said specified signals of said input address signals, and said gated program signal corresponding to said programming signal being applied to the gate electrode of said first transistor of said respective word address decoder having input address signals including said specified signals of the input address signals received by said gated program signal generator.

2. A semiconductor PROM device as set forth in claim 1, wherein said semiconductor PROM device further includes:
    inverter means, operatively connected to respective of said plurality of gated program signal generators, for generating inverted signals of said respective gated program signal, each of said inverted signals being applied to the gate electrode of said second transistor of the respective word address decoder whose input address signals include said specified signals of the input address signals received by said gated program signal generator.

3. A semiconductor PROM device as set forth in claim 1 or 2, wherein said device has a write mode and a read mode, and wherein each of said gated program signal generators further comprises a decoder circuit having input terminals operatively connected to receive said specified signals of the input address signals associated with said respective block of word address decoders and said program signal having a potential level varying in response to the change between the write mode and the read mode.

4. A semiconductor PROM device as set forth in claim 3, wherein each of said decoder circuits comprises a NOR gate.

5. A semiconductor PROM device as set forth in claim 4, wherein said NOR gate comprises a plurality of inverter transistors connected parallel to each other and a load transistor connected in series between said high potential voltage and said plurality of inverter transistors.

6. A semiconductor PROM device as set forth in claim 5, wherein said load transistor comprises a depletion mode transistor having a gate electrode operatively connected to said plurality of inverter transistors.

* * * * *

UNITED STATES PATENT AND TRADEMARK OFFICE
CERTIFICATE OF CORRECTION

PATENT NO. : 4,374,430

DATED : FEBRUARY 15, 1983

INVENTOR(S) : HIGUCHI

It is certified that error appears in the above-identified patent and that said Letters Patent is hereby corrected as shown below:

FRONT PAGE, [57] ABSTRACT, line 11, delete "a plurality of"; and after "of" (third occurrence) insert --a plurality of--.

Col. 1, line 9, delete "into";
line 10, "to" should be --into--;
line 38, "PRG" should be --$\overline{PRG}$--.

Col. 3, line 42, delete "the".

Col. 4, line 43, "$a_o$" should be --$\overline{a}_o$--;
line 44, delete "of";
line 47, "disabled" should be --disabling--.

Col. 5, line 18, "$\overline{a}_o,a_1;a_o,a_1;$" should be --$\overline{a}_o,a_1,a_o,a_1;$--;
line 24, "$a_o,a_1;a_o,a_1;a_o,a_1;a_o,a_1$" should be --$a_o,a_1;\overline{a}_o,a_1;a_o,\overline{a}_1;\overline{a}_o,\overline{a}_1$--;
line 29, "($DEC_7$, ($DEC_8$)" should be --($DEC_7,DEC_8$)--;
line 35, "$a_o$" should be --$\overline{a}_o$--.

Col. 7, [spacing should be single not double].

Signed and Sealed this

Sixteenth Day of August 1983

[SEAL]

Attest:

GERALD J. MOSSINGHOFF

*Attesting Officer*  *Commissioner of Patents and Trademarks*